United States Patent [19]

Shirasaki et al.

[11] Patent Number: 5,895,692
[45] Date of Patent: Apr. 20, 1999

[54] MANUFACTURING OF ORGANIC ELECTROLUMINESCENT DEVICE

[75] Inventors: Tomoyuki Shirasaki, Hachioji; Seizo Miyata, Houya, both of Japan

[73] Assignee: Casio Computer Co., Ltd., Tokyo, Japan

[21] Appl. No.: 08/904,239

[22] Filed: Jul. 31, 1997

Related U.S. Application Data

[63] Continuation of application No. 08/362,815, Dec. 22, 1994, abandoned.

[30] Foreign Application Priority Data

Dec. 28, 1993 [JP] Japan ................ 5-352520
Jul. 27, 1994 [JP] Japan ................ 6-196057

[51] Int. Cl.$^6$ ................ B05D 3/00; B05D 5/06; H01J 1/62; H01J 63/04
[52] U.S. Cl. ................ 427/557; 427/559; 427/64; 427/68; 427/6; 313/504
[58] Field of Search ................ 427/557, 559, 427/64, 66, 68, 69, 71, 73, 75; 313/504

[56] References Cited

U.S. PATENT DOCUMENTS

| | | | |
|---|---|---|---|
| 4,684,353 | 8/1987 | de Souza | 427/66 |
| 4,720,432 | 1/1988 | Van Slyke et al. | 313/504 |
| 4,769,292 | 9/1988 | Tang et al. | 313/504 |
| 4,982,135 | 1/1991 | Benbow et al. | 427/66 |
| 5,024,791 | 6/1991 | Cusano et al. | 264/21 |
| 5,194,290 | 3/1993 | Robertson | 427/66 |
| 5,247,226 | 9/1993 | Sato et al. | 313/504 |
| 5,260,163 | 11/1993 | Nebe et al. | 430/198 |
| 5,343,050 | 8/1994 | Egusa et al. | 257/40 |
| 5,360,694 | 11/1994 | Thien et al. | 430/200 |

Primary Examiner—Marianne Padgett
Attorney, Agent, or Firm—Frishauf, Holtz, Goodman, Langer & Chick

[57] ABSTRACT

A process for manufacturing an organic electroluminescent device, including the steps of sequentially forming a hole transport layer, a bipolar transport layer at need, and an electron transport layer on a transparent electrode side of a transparent substrate having a transparent electrode. After a recombination region layer for electrons and holes of the transport layers is formed, three kinds of fluorescent pigment R, G and B are applied to an upper surface of the recombination region layer. Subsequently, the kinds of fluorescent pigment are heated to be diffused in the recombination layer so that the kinds of fluorescent pigment and the recombination layer constitute a luminescent layer. An organic electroluminescent device produced by this process is disclosed.

15 Claims, 9 Drawing Sheets

MANUFACTURING OF ORGANIC ELECTROLUMINESCENT DEVICE

This application is a Continuation, of application Ser. No. 08/362,815, filed Dec. 22 1994 now abandoned.

BACKGROUND OF THE INVENTION

1. Field of the Invention

The present invention relates to manufacturing of a charge injection type electroluminescent device using an organic thin-film material.

2. Description of the Related Art

There is an electroluminescent (EL) device as a light-emitting device recently expected to be applied to and partially embodied into a light-emitting unit of a display or a surface light source.

Figure 12:
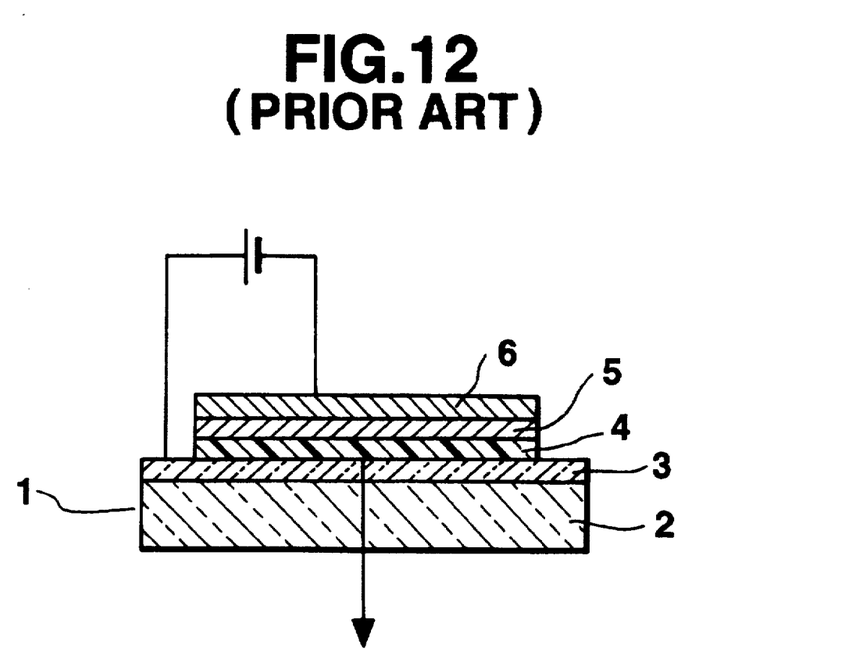
FIG. 12 shows a cross section of a prior-art organic electroluminescent device.

FIG. 12 shows a structure of a prior-art EL device using an organic thin-film material (hereinafter referred to as an organic EL device). The organic EL device 1 comprises a transparent substrate 2, a transparent electrode 3 formed on an upper surface of the transparent substrate 2 and made, e.g., of indium tin oxide (ITO), a thin-film luminescent layer 4 formed on an upper surface of the transparent electrode 3, a thin-film electron transport layer 5 formed on an upper surface of the luminescent layer 4, and a back electrode 6 formed on an upper surface of the electron transport layer 5 and serving as an electron injection electrode.

The luminescent layer 4 serves as a hole transport layer. Fluorescent pigment is previously dispersed in the luminescent layer 4, so that the luminescent layer 4 operates. Electrons injected into the luminescent layer 4 and holes injected into the luminescent layer 4 by means of a field applied between the back electrode 6 and the transparent electrode 3 are recombined primarily in the luminescent layer 4. This generates excitons. A movement of the excitons causes the fluorescent pigment to emit a visible light in accordance with the kind of the fluorescent pigment.

A layer including a region in which electrons and holes such as the luminescent layer 4 are recombined are called a recombination region layer, hereinafter.

In manufacturing the organic EL device described above, particularly in forming the luminescent layer 4, i.e., in making the fluorescent pigment disperse into a dispersion medium layer, a material for the dispersion medium layer and the pigment to constitute dispersoid are dissolved in a common solvent. The resulting solution is applied by dip coating or spin coating to the transparent electrode 3. The applied solution is dried to provide the dispersion medium layer (i.e. a hole transport layer) in which the dispersoid pigment (i.e. fluorescent pigment) is dispersed.

This organic EL device has the following advantages that:

(1) A luminescent wavelength is optionally set since optional fluorescent pigment can be dispersed;

(2) Since a common solvent is used, a material for the luminescent layer can be used, even if it has a low layer forming capability; and (3) When a low-crystallizable dispersion medium layer material such as a polymer is employed the above manufacturing process prevents a failure due to the crystallization of a luminescent material, so that a reduction in the service life of the organic EL device due to the failure can be solved.

In addition, since the organic EL device can theoretically more easily emit a blue light than an inorganic EL device, it is expected to be applied to discrete red, green and blue (RGB) luminescent devices.

In the wet process employing the dip coating or spin coating for forming the luminescent layer of the organic EL device of FIG. 12, it is important to select the common solvent in forming the luminescent layer. On the other hand, the thicknesses of the charge transport layers of the organic EL device comprising the electron transport layer, the hole transport layer and if necessary a bipolar transport layer formed between the electron and hole transport layers must be hundreds to thousands angstroms. Thus, if a common solvent is employed in order to meet a layer forming requirement in the wet process, a requirement for forming an optimum layer cannot always be established for the dispersion medium layer material. Thus, it is difficult to form an sufficient dispersion medium layer.

It has been difficult to produce the organic EL device in the form of discrete RGB luminescent devices. This is considered primarily because it is difficult to produce organic thin films constituting RGB pixels in the form of a matrix pixel pattern on the same substrate by, for example, the lithography or screen printing.

Thus, a process for manufacturing an organic electroluminescent device able to provide luminescent colors in accordance with kinds of fluorescent pigments must meet the requirements that the fluorescent pigments provide desired luminescent colors, and the dispersion medium allows the fluorescent pigments to uniformly disperse, and the common solvent easily dissolves the fluorescent pigments and the dispersion medium, and is volatilized without deteriorating the nature of the fluorescent pigments.

In addition, this process must comprise, for each color, the many difficult sequential steps of applying a solution of a kind of fluorescent pigment, a dispersion medium and a common solvent, forming a thin film by the spin coating or the like, drying the thin film, and etching the dried thin film with the masking so that necessary portions remain to form a desired pixel pattern.

This process of the manufacturing the EL device includes, for example, forming a first luminescent layer including a fluorescent pigment which is capable of emitting a first color, etching the luminescent layer into a predetermined pattern, and forming a second luminescent layer including a fluorescent pigment which is capable of emitting a second color different from the first color and etching the second luminescent layer into a predetermined pattern adjacent to the pattern of the first luminescent layer. However, it is difficult to etch the first and second luminescent layers into accurate patterns, and consequently, there is an interval or an overlap between the patterns of the first and second luminescent layers.

Since a top electrode or the carrier transport layer is arranged on the first and second luminescent layers, the electrode or the layer is discontinued easily and their surface may be uneven. Hence, the electrical and optical characteristics of the multicolored EL device deteriorate.

SUMMARY OF THE INVENTION

The present invention was made in view of the above-described situation.

A primary object of the present invention is to provide a process for manufacturing an organic electroluminescent device which forms layers without employing a common solvent for desired dispersoid fluorescent pigment and a dispersion medium and optionally selects fluorescent pigment without being limited by the nature of a charge transport layer to constitute a dispersion medium.

A further object of the present invention is to provide a productive process for manufacturing an organic multicolor or full-color electroluminescent device which is capable of emitting a plurality of luminescent colors such as red, green and blue.

In order to achieve the primary object, a process for manufacturing an organic electroluminescent device comprises the steps of providing a first electrode and a first layer on the first electrode, the first layer having fluorescent materials which include a fluorescent pigment which is capable of emitting a predetermined color on the first layer, applying energy at least to one of the fluorescent materials and the first layer so as to diffuse the fluorescent pigment within the first layer, providing a second layer on the first layer, and providing a second electrode on the second layer.

Since the inventive process employs no common solvent, the process is not restricted to a property such as the compatibility between the fluorescent pigment and a layer to be the fluorescent layer, so that the kind of the fluorescent pigment and the layer to be the fluorescent layer are freely selected.

In order to achieve the further object, a second aspect of the present invention comprises the steps of providing an upper surface of a transparent substrate with a plurality of striped transparent electrodes, providing a first layer including organic materials having characteristics of transporting holes, on upper surfaces of the transparent electrodes, providing a plurality of fluorescent materials including kinds of fluorescent pigments which are capable of emitting red, green and blue luminescent colors, respectively, and a solvent for dissolving the fluorescent pigments, on an upper surface of the first layer, heating the fluorescent materials or the first layer to inject the kinds of fluorescent pigments into the first layer, providing a second layer including organic materials having a characteristic of transporting electrons to the first layer, on the upper surface of the first layer, and providing a plurality of striped back electrodes on an upper surface of the second layer, the back electrodes being arranged transversely to the transparent electrodes.

Thus, the inventive process concurrently inject the kinds of fluorescent pigment without the need for employing the common solvent. The inventive process provides an organic EL device having an uniform layer thickness and therefore a good optical characteristic.

BRIEF DESCRIPTION OF THE DRAWINGS

The accompanying drawings, which are incorporated in and constitute part of the specification, illustrate presently preferred embodiments of the invention, and together with the general description given above and the detailed description of the preferred embodiments given below, serve to explain the principle of the invention.

DETAILED DESCRIPTION OF THE PREFERRED EMBODIMENTS

Preferred embodiments of the present invention will be described with reference to the drawings, hereinafter.

Figure 1:
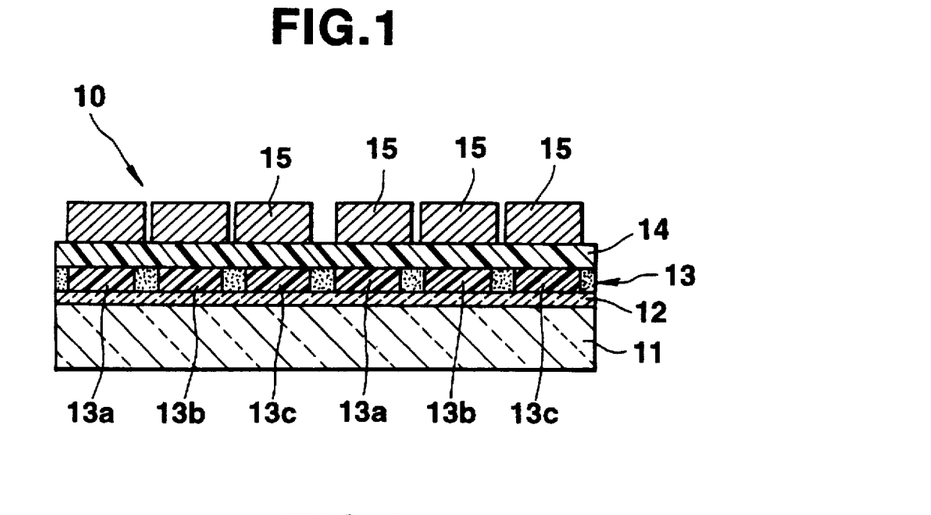
FIG. 1 shows a cross section of an organic electroluminescent device manufactured by a process for manufacturing an organic electroluminescent device according to an embodiment of the present invention.
Figure 2:
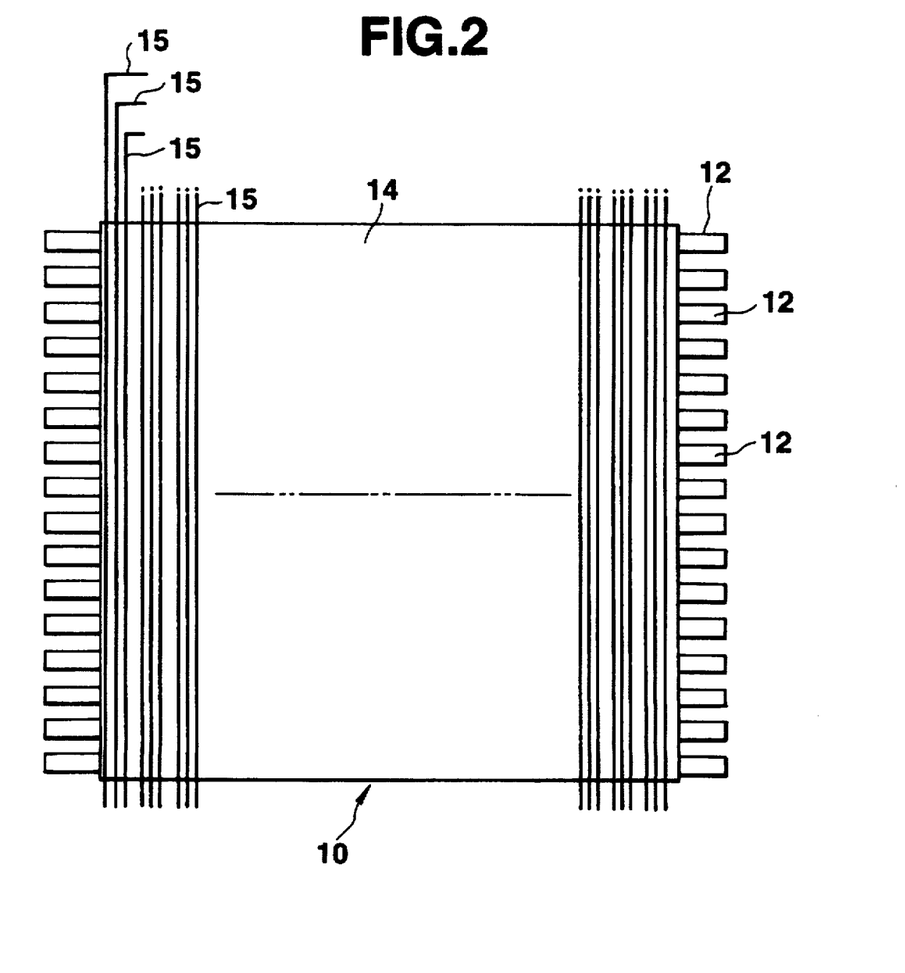
FIG. 2 is a plan view of the organic electroluminescent device of FIG. 1.

FIGS. 1 and 2 show an organic EL device for color matrix display according to an embodiment of the present invention.

The organic EL device 10 comprises a board-shaped transparent substrate 11, striped transparent electrodes 12 of indium tin oxide (ITO) or the like formed on an upper surface of the transparent substrate 11, a continuous luminescent layer 13 formed on an upper surface of the transparent electrodes 12, an electron transport layer 14 formed on upper surfaces of the luminescent layer 13, and striped metal electrodes 15 formed on an upper surface of the electron transport layer 14 transversely to the transparent electrodes 12 and reflecting light from the luminescent layer 13.

The transparent electrodes 12 and the metal electrodes 15 are transverse to each other to constitute a matrix electrode.

The luminescent layer 13 comprises a dispersion medium layer, for example, of poly-N-vinylcarbazole (PVCZ) and serving as a single hole transport layer 16, and kinds of fluorescent pigment constituting kinds of dispersoid pigment and diffused in the dispersion medium layer between the transparent electrodes 12 and the metal electrodes 15.

Figure 3:
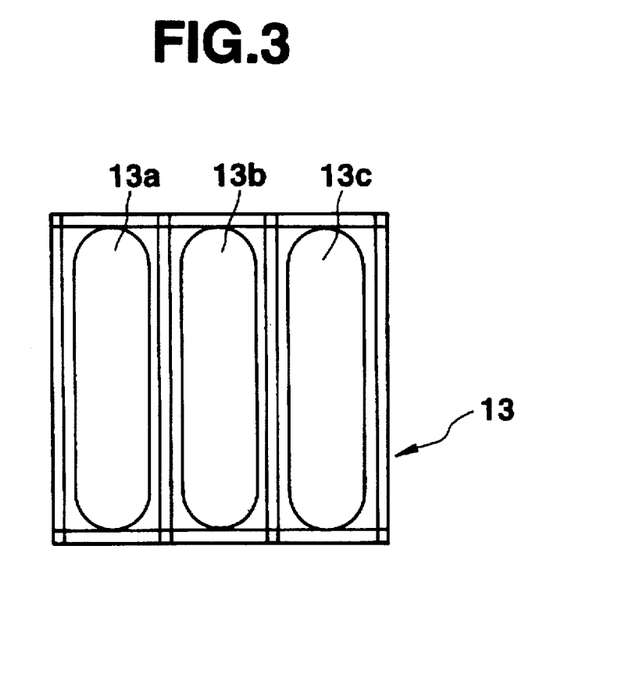
FIG. 3 shows the structure of an example of a luminescent layer of an organic electroluminescent device of the present invention.

As shown in FIGS. 1 and 3, three kinds of fluorescent pigment which are capable of emitting red, green and blue luminescent colors are diffused in the single luminescent layer 13. That is, the kinds of fluorescent pigment being capable of emitting the three-colors are separately diffused in a hole transport layer 16. In other words, each red luminescent portion 13a, each green luminescent portion 13b and each blue luminescent portion 13c are separately formed in the luminescent layer 13. Coumarins (green to yellow), perylenes (red), oxazoles (green to yellow), oxazines, naphthalenes (flue) and quinolines, which have fluorescent wavelengths longer than that of each luminescent layer 13 and/or fluorescent yields greater than that of each luminescent layer 13, are appropriately employed as the fluorescent pigment.

The electron transport layer 14 is made, for example, of aluminum oxo-complex or a laminate composed of aluminum oxo-complex and a triazole derivative.

The luminescent layer or hole transport layer 13, the electron transport layer 14 and a bipolar transport layer may alternatively be made of conductive polymers other than the above described. For example, the luminescent layer or recombination region layer 13 may be made of or contain a polymerized gel, so that the polymerized gel provides a dispersion medium layer serving as the hole transport layer. The dispersion medium layer of the polymerized gel allows the kinds of fluorescent pigment to more easily be diffused than the dispersion medium layer of poly-N-vinylcarbazole. In addition, the dispersion medium layer of the polymerized gel facilitates a material other than the kinds of fluorescent pigment to be diffused. This improves the transportation capability of the luminescent layer 13. Also, this facilitates a dopant to be injected for reducing the barrier against the hole injection from an anode. Thus, the thin-film characteristic of the luminescent layer 13 can positively be improved.

Alternatively, the luminescent layer 13 may be made of porous silicon. In this case, porous silicon provides a dispersion medium layer serving as the hole transport layer. A luminescent layer of porous silicon is derived from a polysilicon layer which is formed by the chemical vapor deposition (CVD) on each transparent electrode 12 of ITO and pored by the anodization. The luminescent layer of the porous silicon provides a uniform luminance since it is provided by the dry process in the form of a layer having a uniform thickness and a uniform electronic property.

Each metal electrode 15, which serves as a back electrode is made of a material (such as In, Mg or Ca) having a low work function and a high electron injection ability. Thus, each of the transparent electrode 12 and the metal electrode 15 efficiently injects carriers (i.e. holes and electrons) and holes and electrons are efficiently recombined in the luminescent layer 13. This improves the operation of the organic EL device 10.

The respective luminescent portions 13a, 13b and 13c are arranged at the intersections of the matrix electrode. In the above-described organic EL device 10, electrons injected by the metal electrodes 15 pass through the electron transport layer 14 to the luminescent layer 13. On the other hand, holes injected by the transparent electrodes 12 are transferred to the luminescent layers 13. The holes and the electrons recombine in the luminescent layers 13, so that the luminescent layers 13, emits a luminescent color in accordance with the kinds of fluorescent pigment.

A mechanism that the hole transport layer (HTL) of the organic EL device 10 serves as the luminescent layer (i.e. the electronic property of a thin-film material for the electron transport layer (ETL) and the HTL) will be described with reference to FIG. 4, hereinafter.

Figure 4:
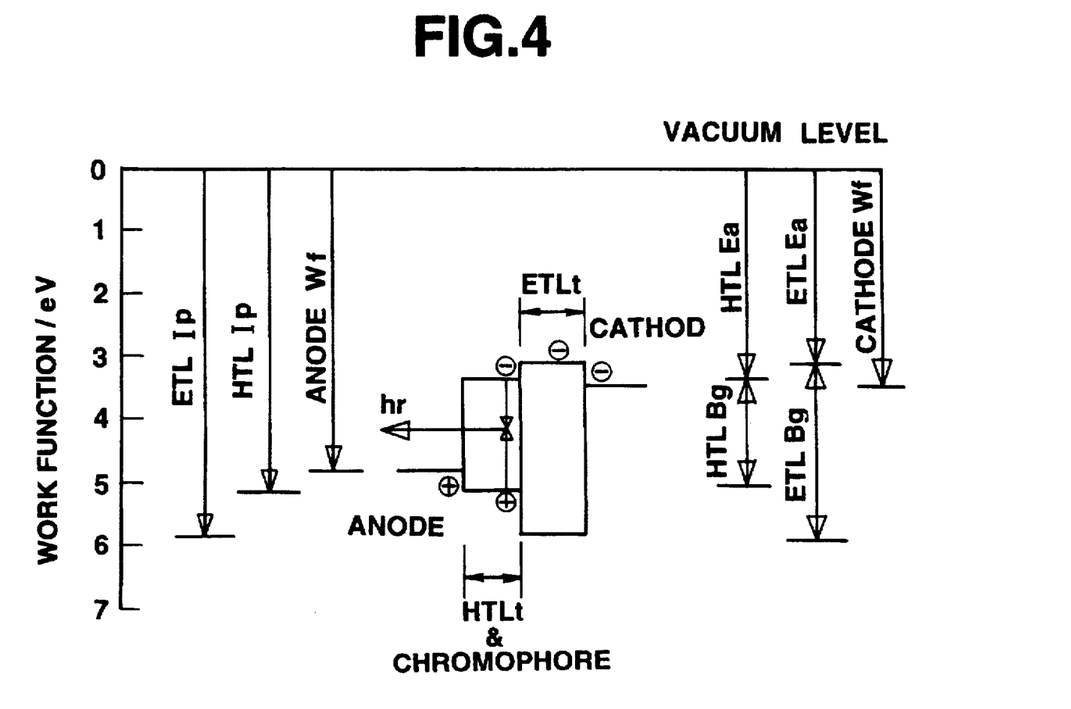
FIG. 4 is a diagram indicative of a relation between the ionization potential and the electron affinity of a charge transport layer of the organic electroluminescent device.

FIG. 4 is an energy diagram indicative of the energy of a carrier in the form of a work function (i.e. a work load when an electron is drawn to point at infinity against the restriction of coulomb force in each thin-film layer, where Ip represents the thin-film layer ionization potential, Ea represents the absolute value of the electron affinity, Wf represents a work function, Bg represents the bandgap, and t represents a layer thickness. The potential of electron decreases in the entity as the work function Wf of an entity increases. On the other hand, as the work function Wf of an entity decreases, the potential of hole decreases in the entity.

There is an energy barrier of a magnitude between the work function Wf of a cathode (i.e. the metal electrode 15) and the absolute value of the electron affinity Ea of the ETL. However, since the energy barrier is sufficiently low with respect to an external electric field, forming the external electric field facilitates the electron injection from the cathode into the ETL. Electrons spontaneously are transferred from the ETL to the HTL since the potential of electrons degrades from the ETL to the HTL.

On the other hand, there is an energy barrier of a magnitude between the work function Wf of an anode (i.e. the transparent electrode 12) and the ionization potential Ip of the HTL. However, since this energy barrier is sufficiently low with respect to an external electric field, forming the external electric field facilitates holes to be injected from the anode into the HTL.

However, it is difficult to inject holes from the HTL into the ETL since an energy barrier between the ionization potential Ip of the ETL and the ionization potential Ip of the HTL is very high with respect to the external electric field. Thus, holes injected into the HTL are transferred by the external electric field the HTL to near the interface between the HTL and the ETL.

Thus, the holes injected by the anode are confined within the HTL and on the other hand, the electrons pass from the ETL to near the interface between the HTL and the ETL. That is, the holes and the electrons recombine in the HTL side of the interface between the ETL and the HTL. In this case, if the HTL is made of a single substance, the energy of excitons generated by the recombination make a transition to the HTL. However, if the recombination region in the HTL contains fluorescent pigment having a fluorescent wavelength longer than and a fluorescent yield greater than those of the recombination region, the energy of the excitons; is selectively make a transition to the molecules of the fluorescent pigment, so that the thin layer (i.e. the HTL) emits light due to the fluorescence of the molecules of the fluorescent pigment.

FIG. 4 illustrates at example in which the HTL constitutes the recombination region layer and the inclusion of the fluorescent pigment in the HTL causes the HTL to serve as the luminescent layer.

Alternatively, depending on thin-film materials for the ETL and the HTL, the ETL may constitute the recombination region layer and therefore serve as the luminescent layer.

Figure 10:
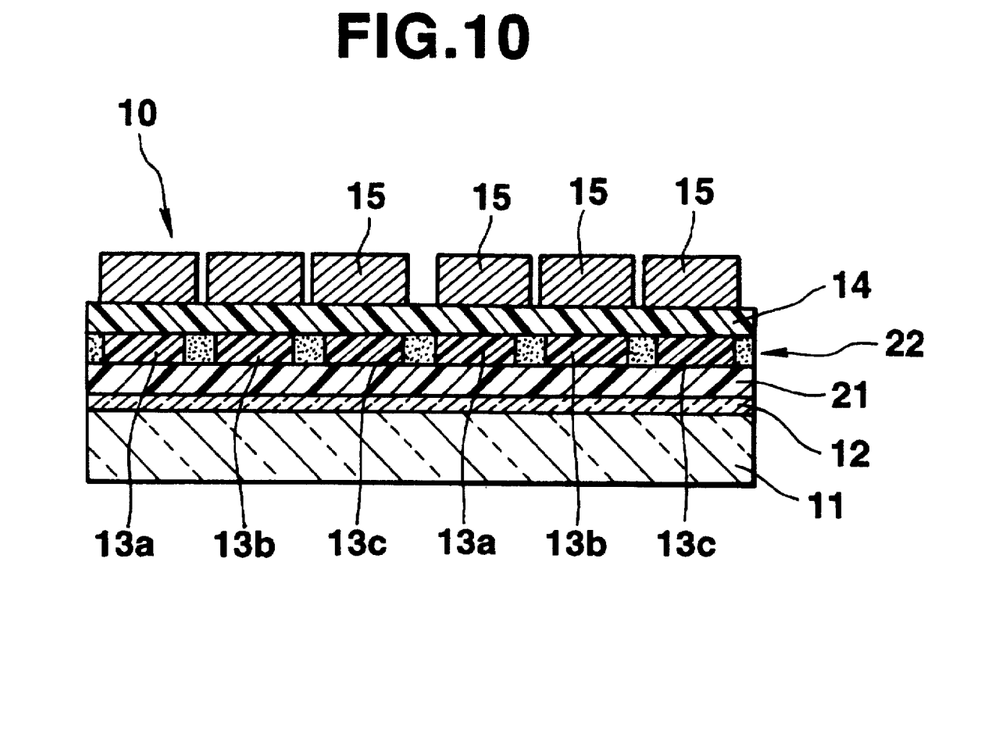
FIG. 10 shows a cross section of an organic electroluminescent device manufactured by the process for manufacturing an organic electroluminescent device according to an embodiment of the present invention.

Alternatively, as shown in FIG. 10, a bipolar transport layer constituting the recombination region layer may be provided between the ETL and the HTL and fluorescent pigment may be provided in the bipolar transport layer so that the bipolar transport layer serves as the luminescent layer.

A process for manufacturing the organic EL device 10 will be described hereinafter.

First, the board-shaped transparent substrate 11 having a transparent electrode layer of ITO or the like formed by the vapor deposition or spattering on a surface of the transparent substrate 11 is prepared.

Figure 5A:
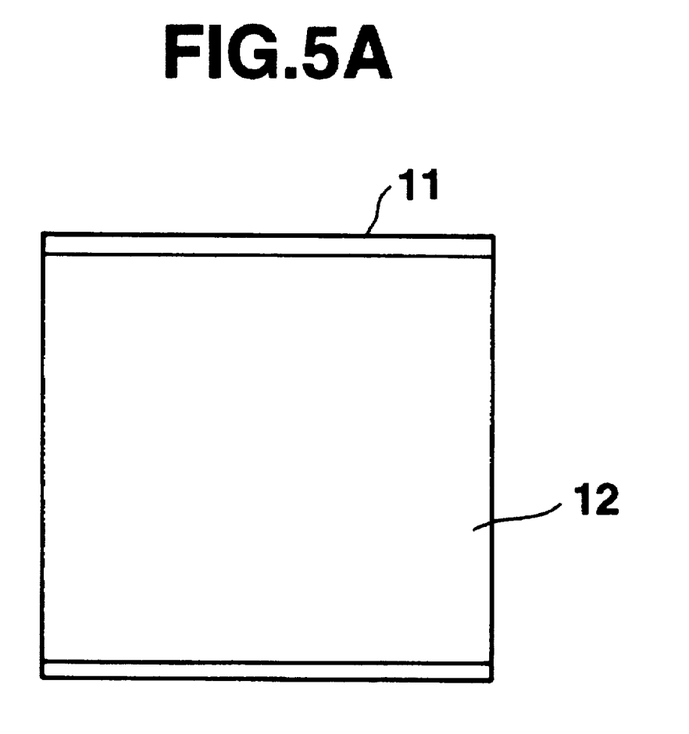
FIG. 5A is a plan view of an intermediary of the organic electroluminescent device, illustrating the step of forming transparent electrodes on the transparent substrate.
Figure 5B:
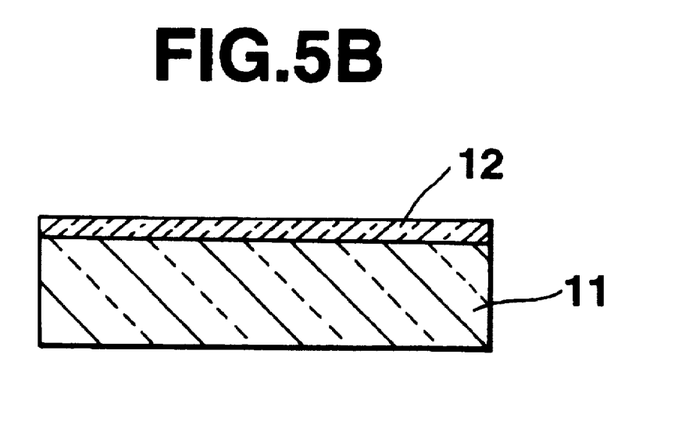
FIG. 5B is a cross section of the intermediary of FIG. 5A.

Subsequently, the transparent electrode layer is patterned in the form of stripes by etching or the like to provide the striped transparent electrodes 12 on the surface of the transparent substrate 11, as shown in FIGS. 5A and 5B.

Figure 6A:
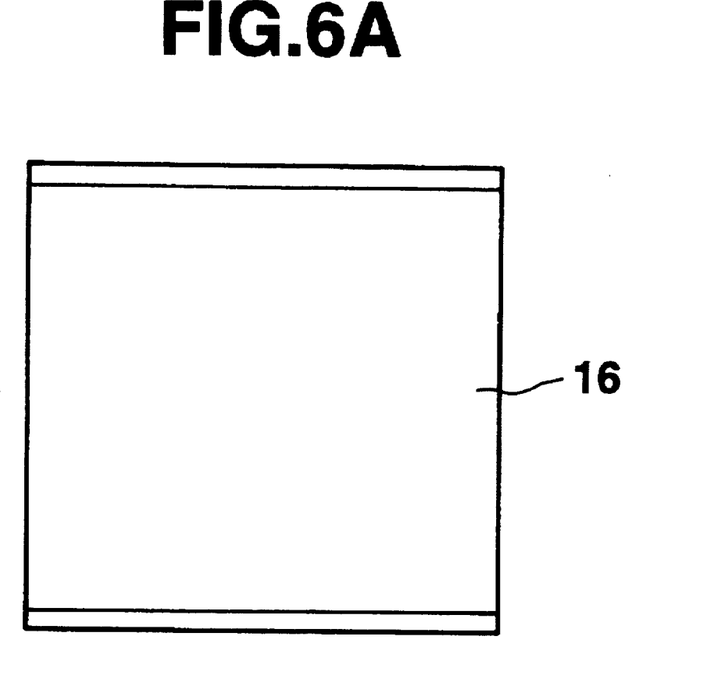
FIG. 6A is a plan view of an intermediary of the organic electroluminescent device, illustrating the step of forming a hole transport layer on the transparent electrodes.
Figure 6B:
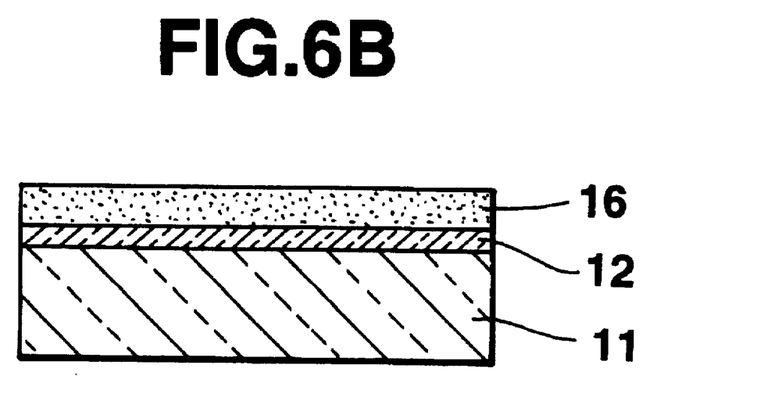
FIG. 6B is a cross section of the intermediary of FIG. 6A.

Subsequently, a material for the hole transport layer such as poly-N-vinylcarbazole (PVCZ) made a layer by the wet process such as the spin coating or dip coating or by the vapor deposition on the transparent electrodes 12 to provide the hole transport layer 16, as shown in FIGS. 6A and 6B.

In layer-making the material for the hole transport layer 16, three intersections between adjacent three of the metal electrodes 15 and each of the transparent electrodes 12 provide a single pixel. Layer-making for each pixel provides the dotted luminescent layer 13. FIGS. 5A, 6A, 7A, 8A, 9A and 10A are plan views of the single pixel. FIGS. 5B, 6B, 7B, 8B, 9B and 10B are cross sections of the single pixel.

Figure 7A:
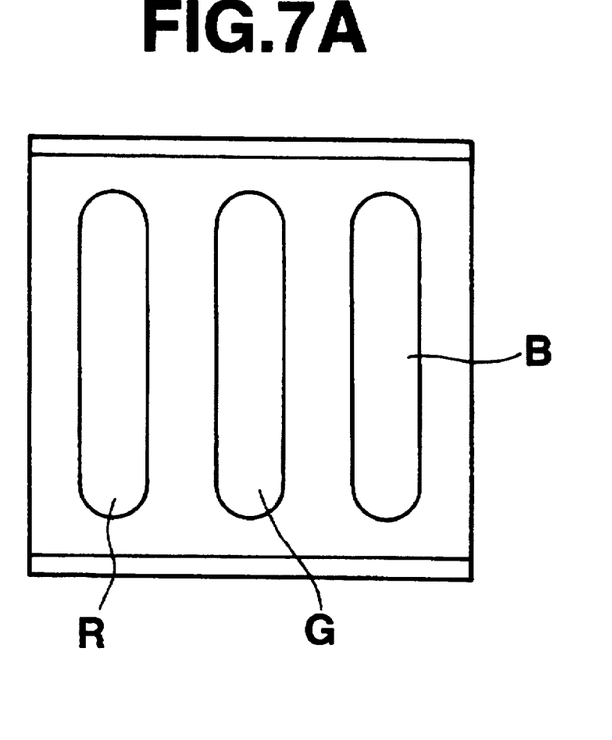
FIG. 7A is a plan view of an intermediary of the organic electroluminescent device, illustrating the step of providing three kinds of fluorescent pigments which are capable of emitting red, green and blue colors on the hole transport layer.
Figure 7B:
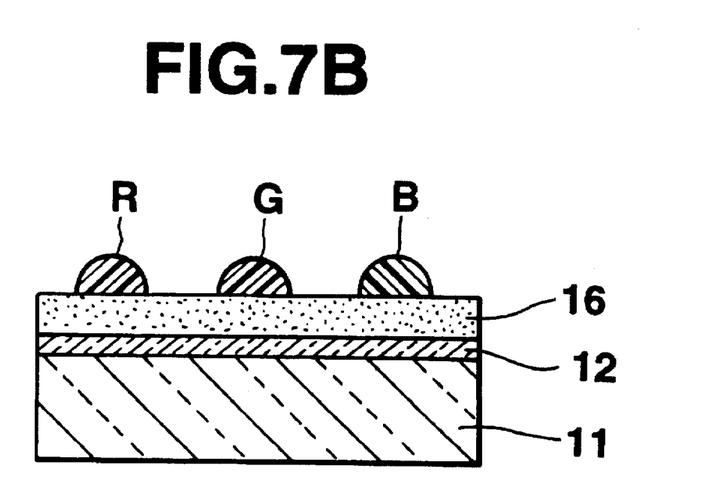
FIG. 7B is a cross section of the intermediary of FIG. 7A.

As shown in FIGS. 7A and 7B, the fluorescent pigment R being capable of emitting red luminescent color, the fluorescent pigment G being capable of emitting green luminescent color and the fluorescent pigment B being capable of emitting blue luminescent color are separately applied by the screen printing or ink-jetting to the hole transport layer 16 so that the three kinds of fluorescent pigment R, G and B are separated from one another. In this case, the kinds of fluorescent pigment R, G and B may be dissolved in solvents to fluorescent materials R', G' and B' which are applied.

Alternatively, the kinds of fluorescent pigment R, G and B may be directly applied.

Figure 8A:
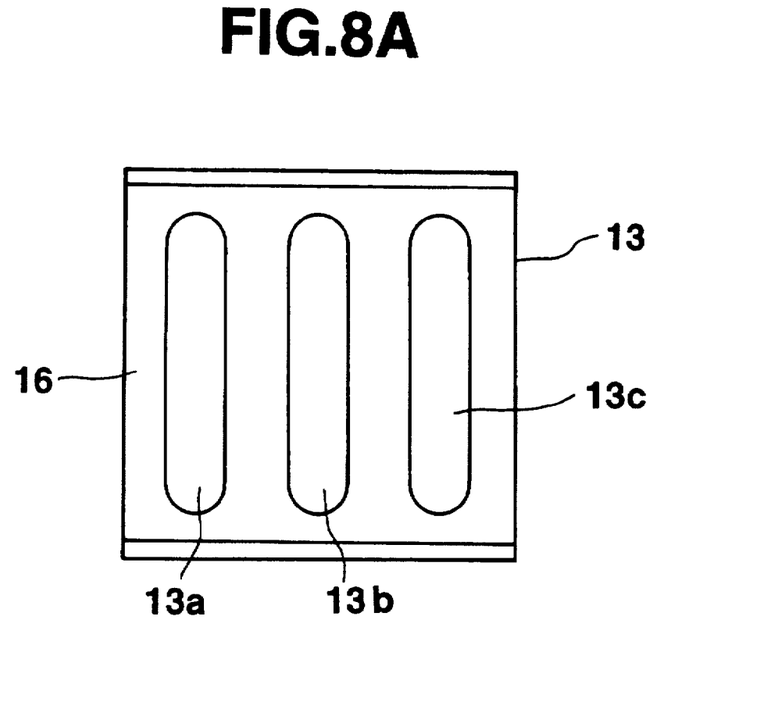
FIG. 8A is a plan view of the intermediary of FIG. 7A, illustrating the step of heating the kinds of fluorescent pigment to be diffused in the hole transport layer.
Figure 8B:
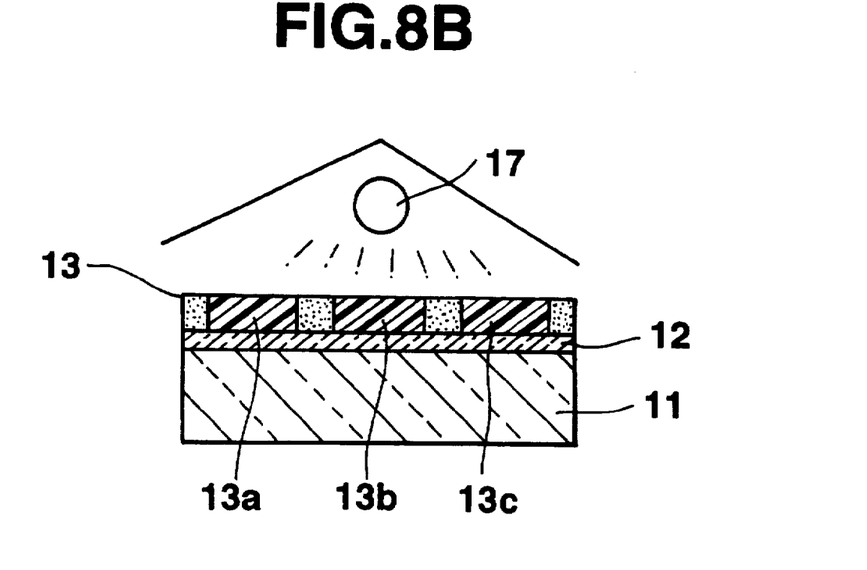
FIG. 8B is a cross section of the intermediary of FIG. 8A.

Subsequently, a surface of the hole transport layer 16 to which the kinds of fluorescent pigment R, G and B or liquid fluorescent materials R', G' and B' are applied receives infrared ray from an infrared ray lamp 17, as shown in FIGS. 8A and 8B. The infrared ray heats the kinds of fluorescent pigment R, G and B and the hole transport layer 16 to diffuse the kinds of fluorescent pigment R, G and B in the hole transport layer 16, so that the red luminescent portion 13a, the green luminescent portion 13b and the blue luminescent portion 13c are formed. Thus, the luminescent layer 13 is concurrently formed.

Alternatively, only the kinds of fluorescent pigment R, G and B or a layer to be the recombination region may be heated in order to heat and diffuse the kinds of florescent pigment R, G and B.

Alternatively, a transparent substrate side of the intermediary of FIG. 8 may be heated. In this case, a heat-conductive heater such as a hot plate may be employed instead of infrared heating. When the transparent substrate side is heated, a sublimination loss in fluorescent pigment of a high sublimability can be reduced since the fluorescent pigment-applied side of the intermediary has a temperature lower than the transparent substrate 11.

Alternatively, the kinds of fluorescent pigment may be diffused in the hole transport layer by applying energy other than heat energy such as electric energy so that the kinds of fluorescent pigment and the hole transport layer provide the luminescent layer.

Figure 9A:
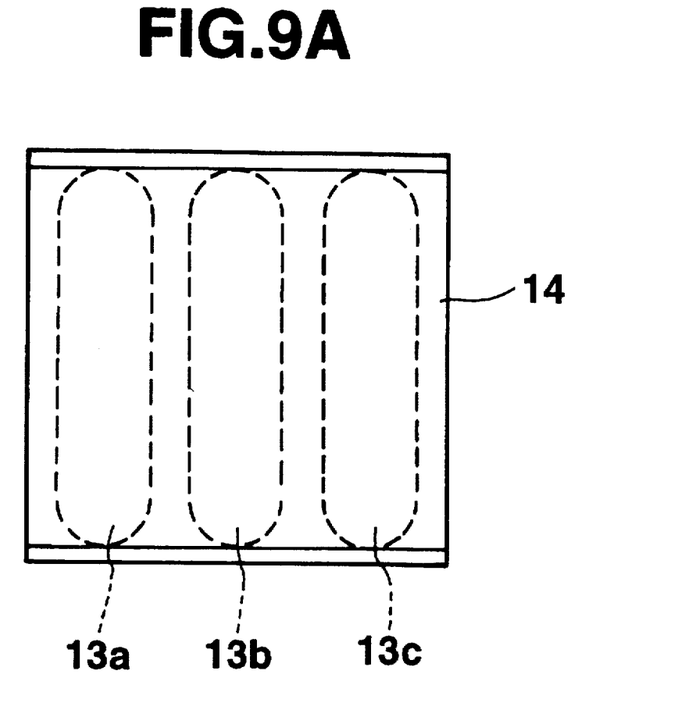
FIG. 9A is a plan view of an intermediary of the organic electroluminescent device, illustrating the step of forming the electron transport layer.
Figure 9B:
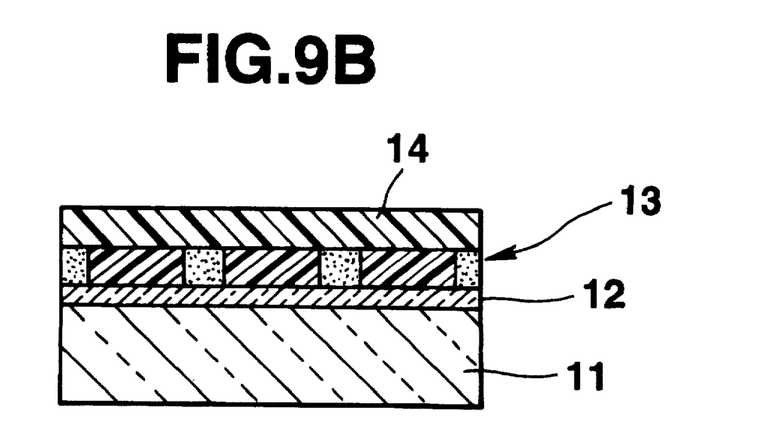
FIG. 9B is a cross section of the intermediary of FIG. 9A.

As shown in FIGS. 9A and 9B, a material for the electron transport layer such as aluminum oxo-complex is subsequently made a layer by the vapor deposition on the luminescent layer 13 to form the electron transport layer 14.

Subsequently, the metal electrodes 15 are formed by spattering on the electron transport layer 14 so as to be transverse to the transparent electrodes 12 opposite the red luminescent portion 13a, the green luminescent portion 13b and the blue luminescent portion 13c. Thus, the organic EL device 10 of FIGS. 1 and 2 is provided.

In the above-descrived embodiments, the organic electroluminescent device is applicable to an active matrix array device.

Figure 11A:
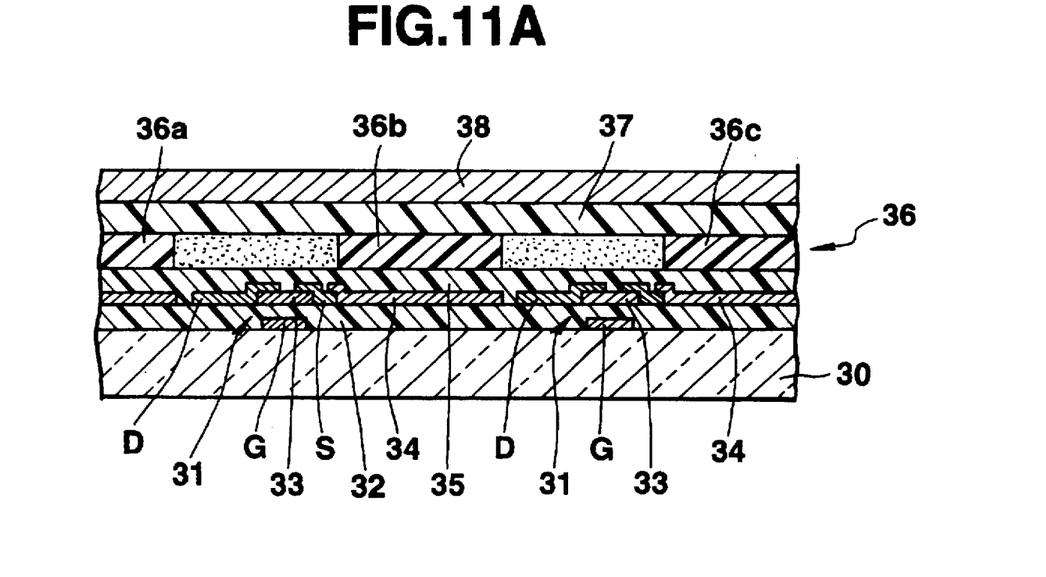
FIG. 11A shows a cross section of another organic electroluminescent device manufactured by the process for manufacturing an organic electroluminescent device according to an embodiment of the present invention.
Figure 11B:
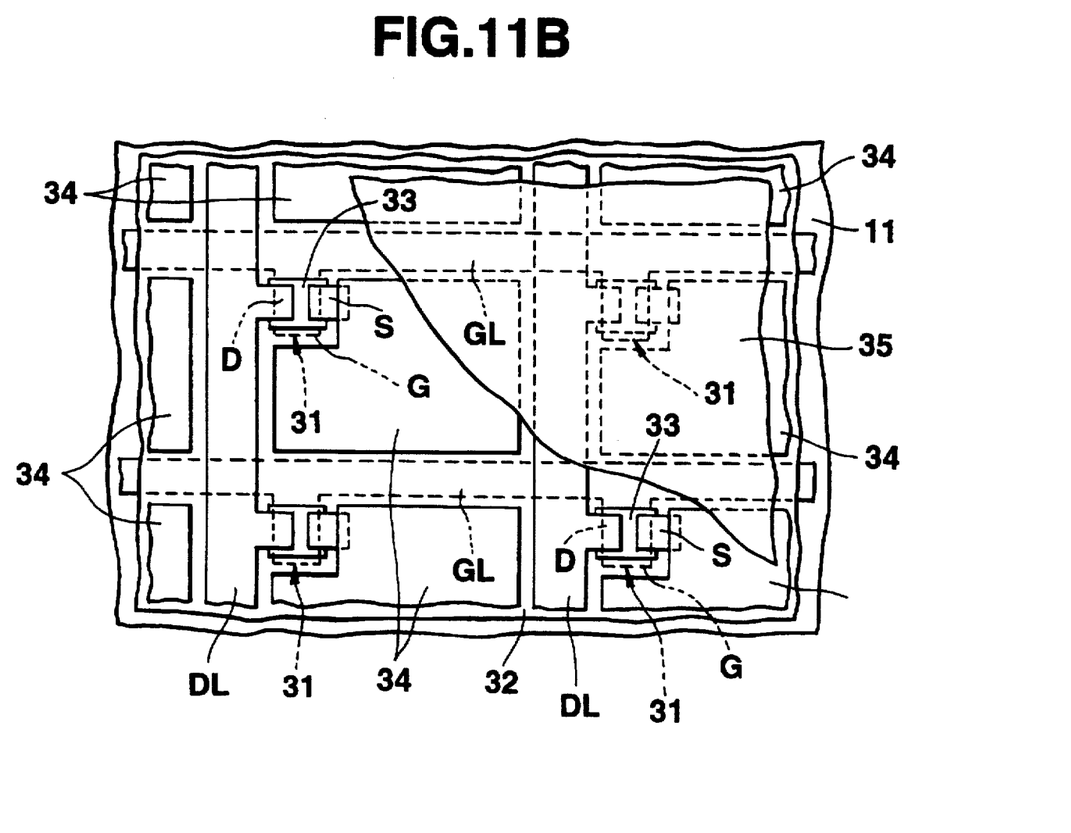
FIG. 11B shows a plan view of a part of FIG. 11A.

FIG. 11A is a cross-sectional view showing a part of the organic electroluminescent device, and FIG. 11B is a plan view showing a part of the substance on which active elements are formed.

The organic electroluminescent device is an active matrix LCD device having thin film transistors (TFT) as active elements. A transparent substrate 30 such as a glass on which transparent pixel electrodes 34 and TFTs 31 or active elements connected to the pixel electrodes 34.

The TFT 14 has, for example, an inverted stagger structure. Specifically, the TFT 14 is composed of a gate electrode G formed on the transparent electrode 30, a gate insulating film 32 of SiN (silicon nitride) or the like covering the gate electrode G, a semiconductor layer 33 of a-Si (amorphous silicon) formed on the gate insulating film 32, and a source electrode S and a drain electrode D formed on the semiconductor layer 33.

Gate lines GL are formed between rows of the pixel electrodes 34 on the transparent electrodes 34, and data lines DL are formed between columns of the pixel electrodes 34. The gate electrodes G of the TFTs 31 are connected to the gate lines GL, and the drain electrodes D are connected to the data lines DL. The gate lines GL, except their terminal portions (not shown), are covered by the gate insulating film 32 of the TFTs 31. The data lines DL are formed on the gate insulating film 32. The pixel electrodes 34 are formed on the gate insulating film 32 and end of each of the pixel electrodes 34 is connected to each of the source electrodes S of the TFTs 31. A thin insulating layer 35 is provided on electrodes surfaces of the transparent substrate 30.

A hole transport layer 36 as a luminescent layer is formed on the thin insulating layer 35 in the above-described process. The hole transport layer 36 has a plurality of red luminescent portions 36a including a fluorescent pigment R, a plurality of green luminescet portions 36b including a fluorescent pigment G and a plurality of blue luminescent portions 36c including a fluorescent pigment B on the thin insulating layer 35 corresponding to pixel electrodes 34. A electron transport layer 37 is formed on the hole transport layer 36. A metal electrode 38 is formed on the hole transport layer 36.

In this embodiment, alternatively, the pixel electrodes 34, the TFTs 31, the gate lines GL and the drain lines DL arranged on the electron transport layer 37 instead of the metal electrodes, and vice versa.

In the above-described process, the hole transport layer 16 to be the recombination region layer is formed. The kinds of fluorescent pigment R, G and B are subsequently applied to the upper surface of the hole transport layer 16. The kinds of applied fluorescent pigment R, G and B are heated to be diffused in the hole transport layer 16. Thus, the kinds of fluorescent pigment R, G and B and the hole transport layer 16 constitute the luminescent layer 13. Thus, the material for the hole transport layer 16 is selected without being substantially restricted by the physical properties of the kinds of fluorescent pigment R, G and B.

On the other hand, the kinds of fluorescent pigment R, G and B are selected without being substantially restricted by physical properties of the material for the hole transport layer 16 since the kinds of fluorescent pigment R, G and B are diffused in the hole transport layer 16 after the hole transport layer 16 is formed.

The inventive process easily provides the organic EL device since the inventive process employ no patterning, such as the lithography or screen printing which cause deterioration of characteristics of emitting, in order to form the luminescent layer 13. This increases the yield of the superior organic EL device and reduces a cost in manufacturing the organic EL device.

Since the luminescent layer 13 includes the red luminescent portion 13a, the green luminescent portion 13b and the blue luminescent portion 13c separated from one another and placed at the intersections of the transparent electrodes 12 and the metal electrodes 15, the matrix electrode consisting of the transparent electrodes 12 and the metal electrodes 15 is driven to mix the respective luminescent colors, so that the organic EL device provides a full-color and multi-color displays.

In the process according to the above-described embodiment, the kinds fluorescent pigment R, G and B are separately applied and concurrently heated to be diffused. The present invention is not limited to this process. For example, first, the red fluorescent pigment R or material R' may be applied and dried. Second, the green fluorescent pigment G or material G' may be applied and dried. Third, the blue fluorescent pigment B or material B' may be applied and dried. At last, the kinds of dried fluorescent pigment or the materials R or R', G or G' and B or B' may concurrently be diffused in the recombination region layer.

Alternatively, first, the red fluorescent pigment R or material R' may be applied and diffused by heating. Second, the green fluorescent pigment G or material G' may be applied and diffused by heating. Third, the blue fluorescent pigment B or material B' may be applied and diffused by heating. Thus, the step of the application and heating-diffusion may be repeated for each kind of fluorescent pigment.

The above process employs the three kinds of the red, green and blue fluorescent pigment and forms the respective luminescent portions corresponding to the three kinds of fluorescent pigment. Alternatively, only one or two of the kinds of fluorescent pigment R, G and B may be employed. Alternatively, kinds of fluorescent pigment being capable of emitting colors (for example, cyan, yellow and magenta) other than red, green and blue may be employed.

The above-described embodiments employ the luminescent layer 13 in which luminescent portions 13a, 13b and 13c are arranged in matrix. Alternatively, the luminescent portions 13a, 13b and 13c may be striped. Alternatively, the overall luminescent layer 13 may be striped.

In the above-described embodiments, the hole transport layer 16 constitutes the recombination region, and the kinds of fluorescent pigment are diffused in the hole transport layer so that the hole transport layer and the kinds fluorescent pigment constitute the luminescent layer 13.

Alternatively, the electron transport layer may constitute the recombination region layer and therefore the luminescent layer by selecting thin-film materials for the electron transport layer and the hole transport layer, as described above.

Alternatively, as shown in FIG. 10, the bipolar transport layer sandwiched between the electron transport layer and the hole transport layer may constitute the recombination region layer and therefore the luminescent layer.

What is claimed is:

1. A process for manufacturing an organic electroluminescent device, comprising steps of:

providing a first electrode;

providing a first organic layer on the first electrode, said first organic layer including a bipolar transport compound in which electrons and holes are recombined;

providing a solvent and fluorescent pigments in the solvent on the first organic layer after the first organic layer has been provided on the first electrode, said fluorescent pigments being capable of emitting a light;

applying energy to at least one of the first organic layer and the fluorescent pigments so as to diffuse the fluorescent pigments within the first organic layer;

providing a second organic layer on the first organic layer after said energy has been applied to at least one of the first organic layer and the fluorescent pigments; and providing a second electrode on the second organic layer.

2. The process according to claim 1, wherein said energy comprises heat energy.

3. The process according to claim 2, wherein said heat energy is applied by an irradiating infrared ray.

4. The process according to claim 1, wherein said energy is applied to the first organic layer and the fluorescent pigments concurrently.

5. The process according to claim 1, wherein each of the fluorescent pigments form diffused regions which are separated from one another.

6. The process according to claim 1, wherein the fluorescent pigments comprise a plurality of different fluorescent pigments each capable of emitting a different color.

7. The process according to claim 6, wherein the different fluorescent pigments include a fluorescent pigment capable of emitting a red luminescent color, a fluorescent pigment capable of emitting a green luminescent color, and a fluorescent pigment capable of emitting a blue luminescent color.

8. The process according to claim 6, wherein at least one of the first and second electrodes comprises a plurality of electrodes.

9. The process according to claim 6, wherein said step of providing the solvent and the fluorescent pigments on the first organic layer and said step of applying energy include:

a first step of providing a first one of the different fluorescent pigments on the first organic layer, and thereafter applying said energy to at least one of the first one of the different fluorescent pigments and the first organic layer; and a second sequential step of providing a second one of the different fluorescent pigments on the first organic layer, and thereafter applying said energy to at least one of the second one of the different fluorescent pigments and the first organic layer.

10. The process according to claim 6, wherein said step of providing the solvent and the fluorescent pigments on the first organic layer includes providing a first one of the different fluorescent pigments on the first organic layer, and thereafter providing a second one of the different fluorescent pigments on the first organic layer.

11. The process according to claim 1, wherein the first organic layer includes a gel polymer.

12. The process according to claim 1, wherein the first organic layer further includes a hole transport compound capable of transporting holes.

13. A process for manufacturing an organic electroluminescent device, comprising steps of:

providing an upper surface of a transparent substrate with a plurality of striped transparent electrodes;

providing a first organic layer, which includes a material capable of transporting holes, on upper surfaces of the striped transparent electrodes;

providing a red fluorescent pigment, a green fluorescent pigment and a blue fluorescent pigment, each separated from one another, on an upper surface of the first organic layer after the first organic layer has been provided on the upper surfaces of the striped transparent electrodes, said red fluorescent pigment being provided in a first solvent and being capable of emitting a red luminescent color, said green fluorescent pigment being provided in a second solvent and being capable of emitting a green luminescent color, and said blue fluorescent pigment being provided in a third solvent and being capable of emitting a blue luminescent color;

heating at least one of the first organic layer and the red, green, and blue fluorescent pigments to inject the red, green, and blue fluorescent pigments into the first organic layer;

providing a second organic layer, which includes a material capable of transporting electrons, on the upper surface of the first organic layer after at least one of the first organic layer and the red, green and blue fluorescent pigments has been heated; and providing a plurality of back striped electrodes on an upper surface of the second organic layer, said back striped electrodes being arranged transversely to the striped transparent electrodes.

14. The process according to claim 13, wherein the first organic layer further includes a bipolar transport material in which electrons and holes recombine.

15. A process for manufacturing an organic electroluminescent device, comprising steps of:
   providing a substrate on which a first electrode for injecting holes is arranged;
   providing a first layer, which includes a first organic material capable of accepting holes therein, on the first electrode;
   providing a plurality of fluorescent pigments and a solvent for dissolving the fluorescent pigments on the first layer, said fluorescent pigments being capable of generating light;
   applying energy to at least one of the first layer and the fluorescent pigments to diffuse the fluorescent pigments into the first layer; and
   providing a second layer adjacent to the first layer on which a second electrode for injecting electrons is formed after said energy has been applied to at least one of the first layer and the fluorescent pigments, wherein the second layer is capable of transporting electrons.

* * * * *